United States Patent [19]

Chen

[11] Patent Number: 4,914,731
[45] Date of Patent: Apr. 3, 1990

[54] QUICKLY FORMED LIGHT EMITTING DIODE DISPLAY AND A METHOD FOR FORMING THE SAME

[76] Inventor: Shen-Yuan Chen, P.O. Box 10780, Taipei 10099, Taiwan

[21] Appl. No.: 78,318

[22] Filed: Jul. 27, 1987

[51] Int. Cl.⁴ .............................................. G09G 3/32
[52] U.S. Cl. .......................... 340/815.2; 340/762/782; 445/24
[58] Field of Search ................ 340/815.2, 762, 815.03, 340/815.31, 815.33, 782; 357/30 M; 350/167, 417, 320; 445/24

[56] References Cited

U.S. PATENT DOCUMENTS

| | | | |
|---|---|---|---|
| 3,582,300 | 6/1971 | Coombers et al. | 357/30 M |
| 3,918,053 | 11/1975 | Towne et al. | 340/762 |
| 4,134,651 | 1/1979 | England | 350/417 |
| 4,254,453 | 3/1981 | Mouyard et al. | 340/815.2 |
| 4,306,716 | 12/1981 | James et al. | 340/762 |

Primary Examiner—David K. Moore
Assistant Examiner—Jeffery A. Brier
Attorney, Agent, or Firm—Pollock Vande Sande & Priddy

[57] ABSTRACT

A light emitting diode display which may be in the form of an array, dot matrix or number-shaped segments is obtained as follows. First, many lenses are formed by ejection at one time. This keeps the lenses at a definite interval from each other. Then continuous punching and cutting, as well as pressing and encasing, are used, to align the lenses and encase the same into prearranged holes on the display. A reflector is also encased to hold and clamp all the lenses between the display and the reflector. Finally, a circuit board welded with light emitting chips is encased and firmly fixed together with the display.

1 Claim, 9 Drawing Sheets

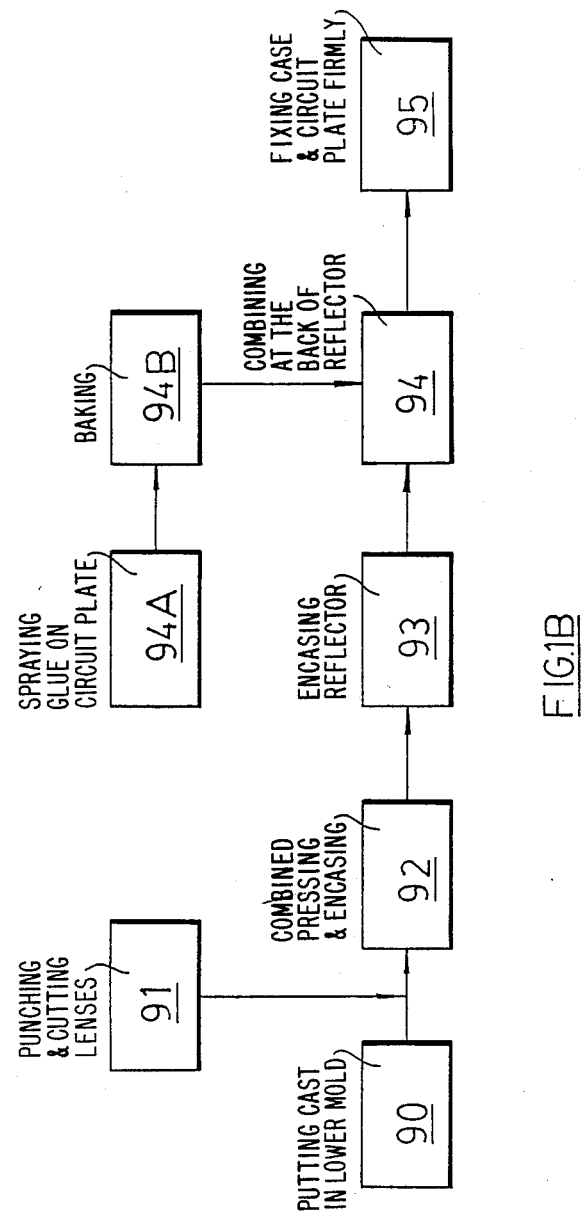

QUICKLY FORMED LIGHT EMITTING DIODE DISPLAY AND A METHOD FOR FORMING THE SAME

BACKGROUND OF THE INVENTION

The invention relates to a new construction of a light emitting diode array, dot matrix or segmented display and a method for forming the same.

A conventional light emitting diode array, dot matrix or segmented display generally consists of a white and reflective display with many holes filled with diffusion epoxy. A circuit board adheres to the bottom of the display and each light emitting chip of the circuit board is kept exactly at the center of the hole where the resin epoxy has the function of insulating and diffusing the light from the chip. However, the display is not allowed to have any impurity or bubble; otherwise, the light intensity become uneven.

As the light emitted by the light emitting chip cannot be entirely reflected by the wall of the hole, quite a bit of light will penetrate and diffuse around the hole wall, and the light of the surface between the holes is dimmed. In order to correct such drawbacks and to strengthen visual contrast between the hole and the display, the display surface, according to conventional manufacturing art, must be printed with opaque printing ink to shield the dim light inside the surface. (so-called light leak or diaphaneity)

As the adjacent displays are not combined tightly during combination, the side of one display is usually higher than the adjacent display. Therefore, its display effectiveness is reduced. For a high-quality reflector, it is necessary to print non-transparent printing ink on the sides of the display, i.e. the five faces of the display must be printed by turns.

A flow chart of manufacturing light emitting diode (LED) display by traditional method is shown in FIG. 1A. (See Appendix at the end of the Specification.)

Obviously, the process of manufacturing conventional LED display is rather tedious, and since there is a big difference in the time for the various operations, bottlenecks occur in the production line and the efficiency of the production is very difficult to upgrade. Furthermore, during the process of filling resin into the display holes, it is very difficult to get rid of bubbles or impurities in the resin that affect the light intensity in the LED display. During inspection after manufacture, if it is discovered that the light intensity of a chip in one hole is different from that in other holes, no disassembly or correction is possible because the resin has hardened in the holes and the chip on the circuit board has adhered firmly with it. Consequently, the whole product has to be discarded and the various parts cannot be reused.

SUMMARY OF THE INVENTION

It is an objective of the invention to provide the construction of a newly combined LED display.

It is another objective of the invention to provide a new method for quick combination of LED display.

It is still another objective of the invention to provide a LED display by which defective items can be repaired and replaced at any time.

It is the last objective of the invention to provide a LED display by which light intensity can be enhanced.

The most obvious industrial values, which the conventional LED display cannot satisfy, of the manufacturing method of the invention are as follows:

(1) Improving the conventional manual art into semi-automatic manufacturing art, and therefore, simplifying the productive flow and upgrading the production speed.

(2) According to the conventional manufacturing method, all constructive items of the display which are discovered to be defective at the final inspection of light intensity cannot be reworked and must be discarded altogether. But in the invention, defective items can be dismantled immediately for repair or replacement. The conventional serviceable rate is roughly kept at 80%–85% and 88% by careful control, while the serviceable rate of this invention can reach over 98%.

(3) The bottle neck (delay & waiting) of the production line can be reduced by this invention. Owing to prolonged production flow in convention art (some processes take 5 seconds and some others take 4 hours), there are many waiting bottlenecks. But there are no bottlenecks in this invention since the display is quickly combined after various constructive items are formed.

(4) The light source is concentrated since the light emitted by the light emitting chip of this invention cannot diffuse around and is reflected by the plating layer. And the light intensity of this product is upgraded when compared to the conventional light emitting chips of the same class. As the diaphaneity lens has an arc surface with light convergence function, the light intensity is upgraded and the diffusion angle of light may be changed with the curvature of the arc surface.

(5) Since the product of this invention does not need to go through the process of printing, it may have any colors printed on the surface as required and such will not be damaged or faded even after it has been used for a long period or suffered abrasion.

BRIEF DESCRIPTION OF THE DRAWINGS

FIG. 1B shows the sequential steps in the fabrication of the display by this invention.

DETAILED DESCRIPTION OF THE PREFERRED EMBODIMENTS

Figure 1A:
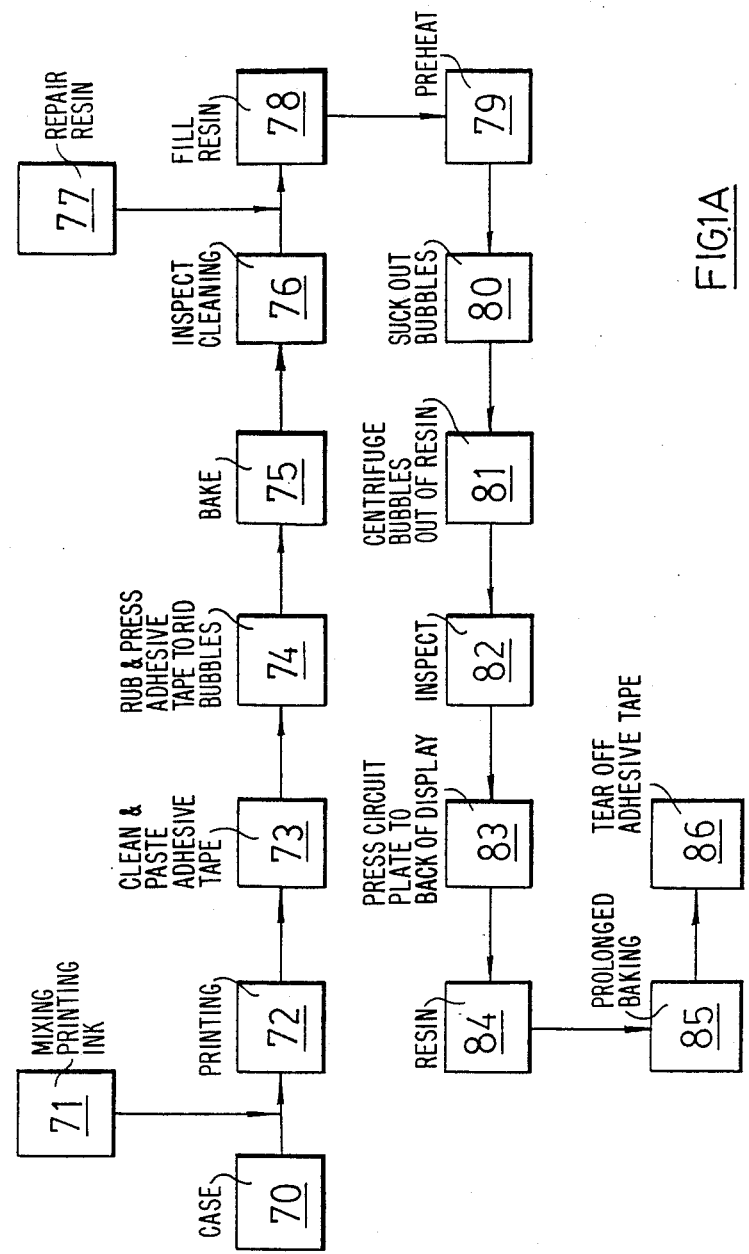
FIG. 1A shows the sequential steps in the fabrication of conventional LED display.

The manufacturing art of this invention is shown in FIG. 1B. (See Appendix) Bowl-shaped cases formed by pre-ejection are put into the lower mold of a punch machine (Box 90). Then a set of lenses formed by pre-ejection (Box 91) and supported by interconnected ribs is put at the top of the case. The ribs interconnecting the lenses are cut by molding tools so that the lenses fall into the diaphanous holes of the case and is combined to the case by pressing (Box 92). A reflector is encased at the back of the case combined with the lenses (Box 93). Further, a circuit board which was pre-fabricated and passed inspection, is glue-sprayed, baked and also encased (Boxes 94A and 94B), so that the case and the circuit board are firmly fixed, and that the display is formed completely (Box 95).

The above art can be applied to array, dot matrix and segmented displays. The preferred embodiments are as follows:

EMBODIMENT 1

Please refer to FIGS. 2, 3, 4, and 5 which show the dot or dot matrix displays made by this invention. A present invention display consists of a case 20, some lenses 30, a reflector 40 and a circuit board 50. Each trough item is pre-formed as shown in the exploded view in FIG. 2.

The inverting rectangular-shaped case 20 has a plurality of holes which are generally formed in a matrix of, such as 5×7, diaphaneity holes 21. There are more than two positioning posts 23 in its shallow trough 24. The whole body of case 20 is formed by ejection of any opaque color plastics. Each hole 21 is a typical countersink that has an annular shoulder (or flange) 22 for encasing lenses 30; some dot-shaped lenses 30 in the same quantity as holes 21 of the case 20 are formed by ejection of plastics with high diaphaneity such as PC acryl. At the bottom of each lens 30 there is a shoulder 31. The respective ends of lens 30 are plane and convex arc in the shape of a bulb lens having light convergence effect.

A reflector 40 formed by ejection of typical ABS plastics has some eddy-shaped holes 41 in the same quantity as holes 21 of case 20. At least two positioning holes 42 are symmetric with case 20. Before combination, the reflector 40 will be plated completely, or only on the portion of eddy-shaped hole 41, with a layer of metal film 43. The position on the circuit board 50, being symmetric with hole 21 of case 20, will be coated with yellow or yellow green light reflecting thin film 53 to construct a light reflecting background for light emitting chip 51. Circuit board 50 is welded with some ships 51, and then sprayed with resin thin film to prevent oxidation and to affix the chips firmly thereon. On the circuit board 50, there are also positioning holes 52 for accepting positioning posts 23 of case 20.

Figure 2:
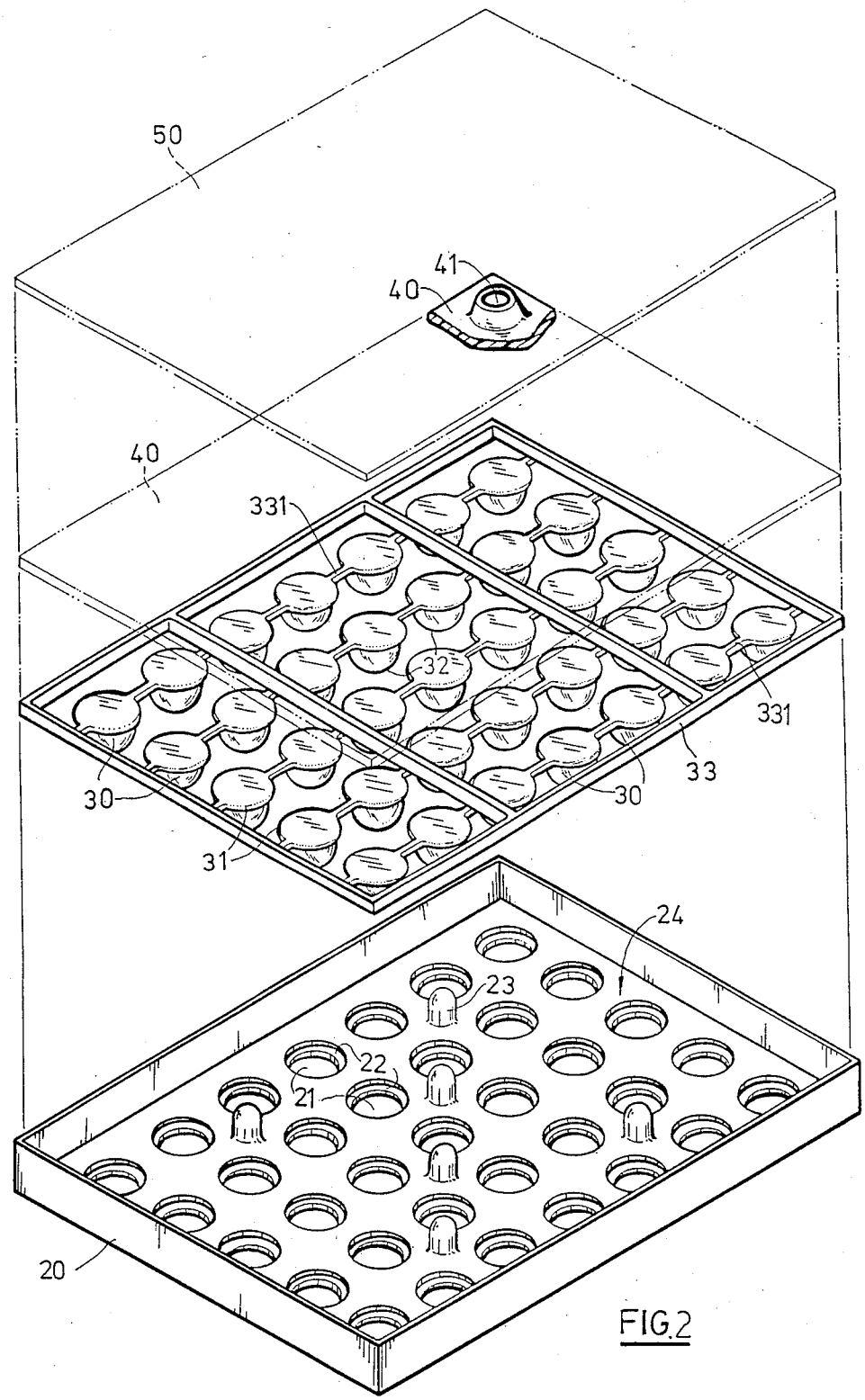
FIG. 2 is a perspective exploded view of the preferred embodiment 1 of this invention and shows various diaphaneity lenses still combined with ribs.
Figure 3:
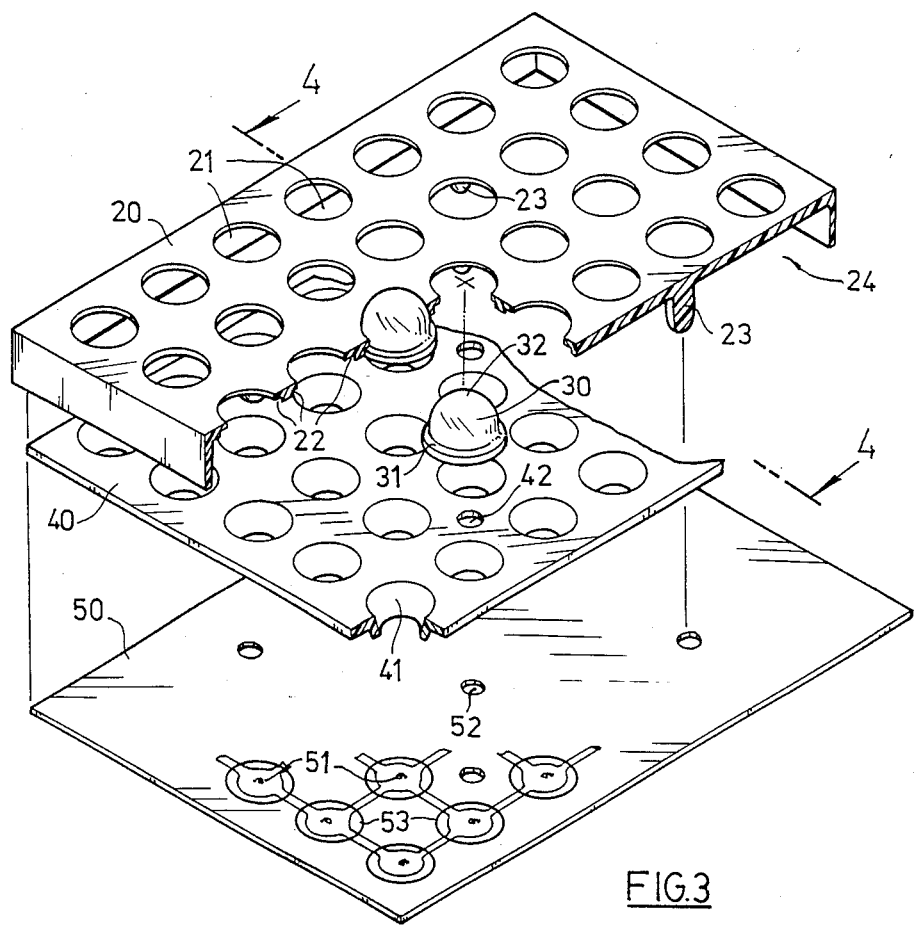
FIG. 3 is a display perspective exploded view of the preferred embodiment 1 of this invention and shows various diaphaneity lenses apart from ribs.

As shown in FIG. 2, the above-mentioned lenses, before combining with the other components have a configuration in the same quantity and interval as holes 21 of case 20 and are rejected together on a rib-shaped support 33, of which the ribs 331 connecting lenses 30 are comparatively tiny.

Figure 4:
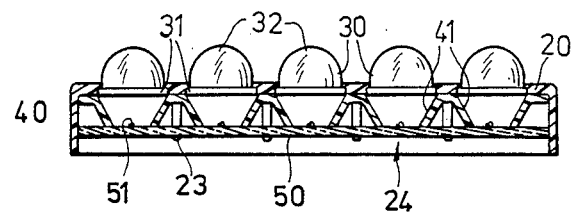
FIG. 4 is the sectional view taken along 4—4 in FIG. 3 and shows the construction of various parts after combination.
Figure 5:
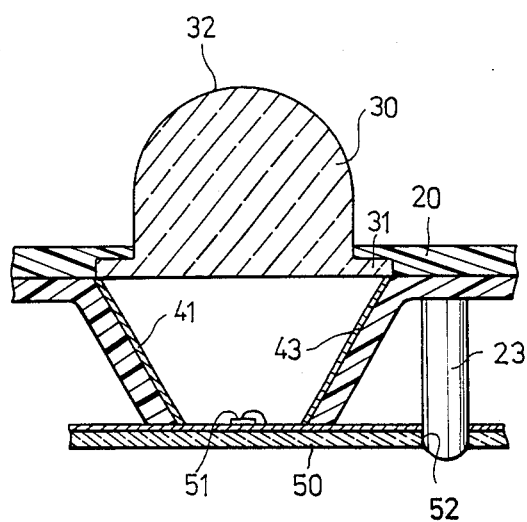
FIG. 5 is a partially enlarged view of FIG. 4.

The art of manufacturing LED display in this invention is as follows: The rectangular-shaped case 20 is positioned with its shallow trough facing upward. The dot-shaped lenses 30, together with its rib-shaped support 33 are sent into molding tools for punching and cutting. The separated lenses 30, shown in FIG. 3, may be entirely pressed into holes 21 of case 20 at the same time, instead of being placed therein one by one. Then the remaining rib-shaped support 33 is withdrawn. After that the preformed and plated reflector 40, by virtue of the alignment and enclosure of the positioning hole 42 with positioning post 23 of the case, is pressed onto the various lenses. Next, the positioning holes 52 of the circuit board 50 are aligned with positioning post 23 of case 20 and encased. Thus, the light emitting chips 51, by melting, are kept in the eddy-shaped holes 41 of reflector 40. At the end of positioning post 23 various constructive items will be speedily fixed to combine a LED display. The construction after combination is shown in FIGS. 4 and 5.

EMBODIMENT 2

Figure 6:
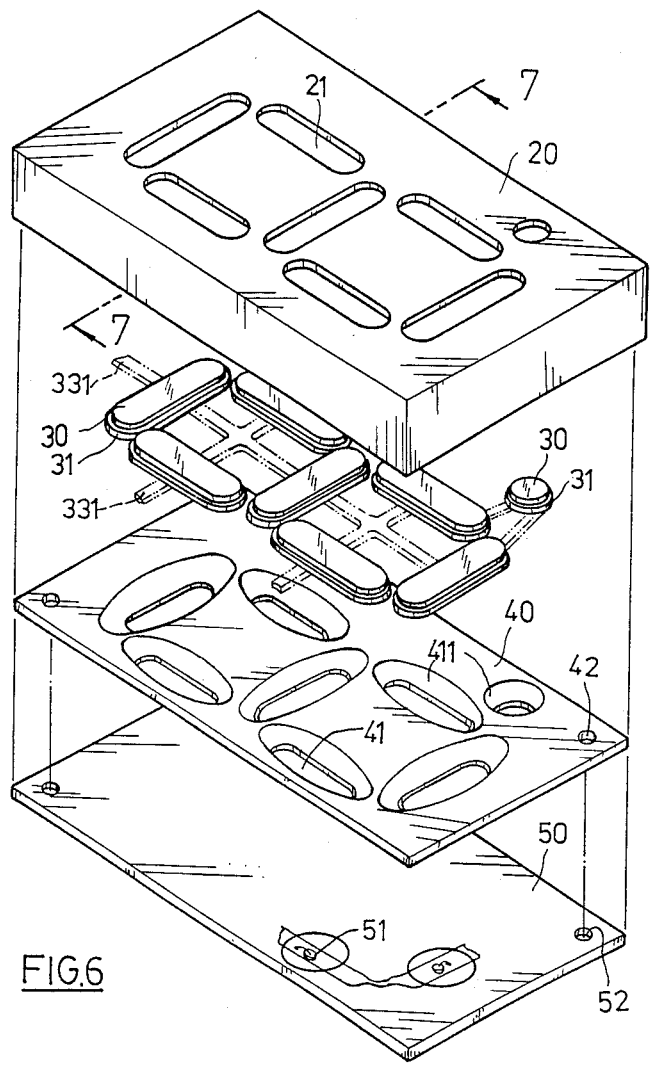
FIG. 6 is a perspective exploded view of the embodiment 2 of this invention.

This embodiment shows the application of the manufacturing art of this invention to the manufacture of segmented display. As shown in FIG. 6, the various lenses 30 formed by pre-ejection are also kept by virtue of rib 31 in the arrangement relationship of an 8-type segmented display.

On case 20, there are four vertical and horizontal long holes 21 to construct an 8-type hole. There may be a single 8-type or some sets of long holes forming multiple 8-type holes on the case 20. The bottom edge of lenses 30 may be in the construction of an arch-shaped arc surface 32 so as to enable the light emitting chips 51 on circuit board 50 to converge the emitting light. Furthermore, the arc surface can be constructed by connecting deflection surfaces, i.e. diamond-shaped multiple surfaces, to upgrade light deflection effectiveness. The upper edge of lenses 30 is a frosted glass surface 34 constructed by some intensive arc surfaces or deflection surfaces. Therefore, the light converged and deflected originally in lenses 30 may become dimmer because of the even dispersement of getting through the frosted glass surface 34.

Similar to the construction of embodiment 1, there is a reflector 40 at the back of lens 30 which have thereon holes 41 similar to the long hole 21 or case 20. Between holes 41 there are arc-shaped hole walls 411 coated with thin metal film 43.

As shown in FIG. 6, the various lenses 30 kept originally on an ejection body are put in the punch machine to cut the lenses 30 and the ribs 331 apart, so that the lenses 30 will fall into the long holes 21 of case 20. Reflector 40 is encased so that various lenses 30 can be inserted and clamped between the reflector 40 and the case 20. Then the circuit board 50 is coated with a yellow green light reflecting film 53 at the position where the central position of the long hole 21 of case 20 is aligned and encased, and a light emitting chip 51 is welded. After weld the chips 51 must be sprayed and coated with resin film 54 which is dried and solidified by being slightly baked so as to prevent oxidation and to upgrade adhering effectiveness.

Figure 7:
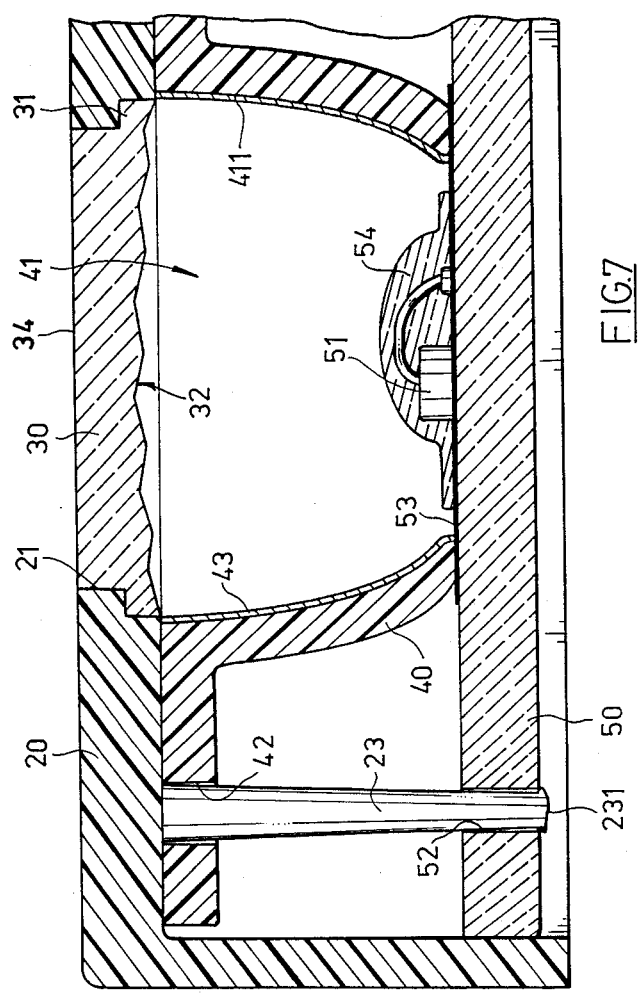
FIG. 7 is a partially sectional view taken along 7—7 in FIG. 6 and shows the construction of various parts after combination.

After the circuit board 50 is treated by the above processes and put at the back of reflector 40, adhesive glue is used to bond them. Or as shown in FIG. 7, positioning posts 23 of case 20 may be used for penetrating in sequence through the positioning holes 42 of reflector 40 and the positioning holes 52 or circuit board 50; and then the end 231 of the positioning post 23 is melted by heat gradually. Circuit board 50 cannot be taken apart from case 20 easily unless the end portion 231 is melted.

Therefore, the circuit board 50 in the display made by this invention can be taken apart from case 20 to replace chip 51 if problems such as uneven light intensity are discovered in the display during final inspection. The inspection and repair of this reflector are made easy.

EMBODIMENT 3

Figure 8:
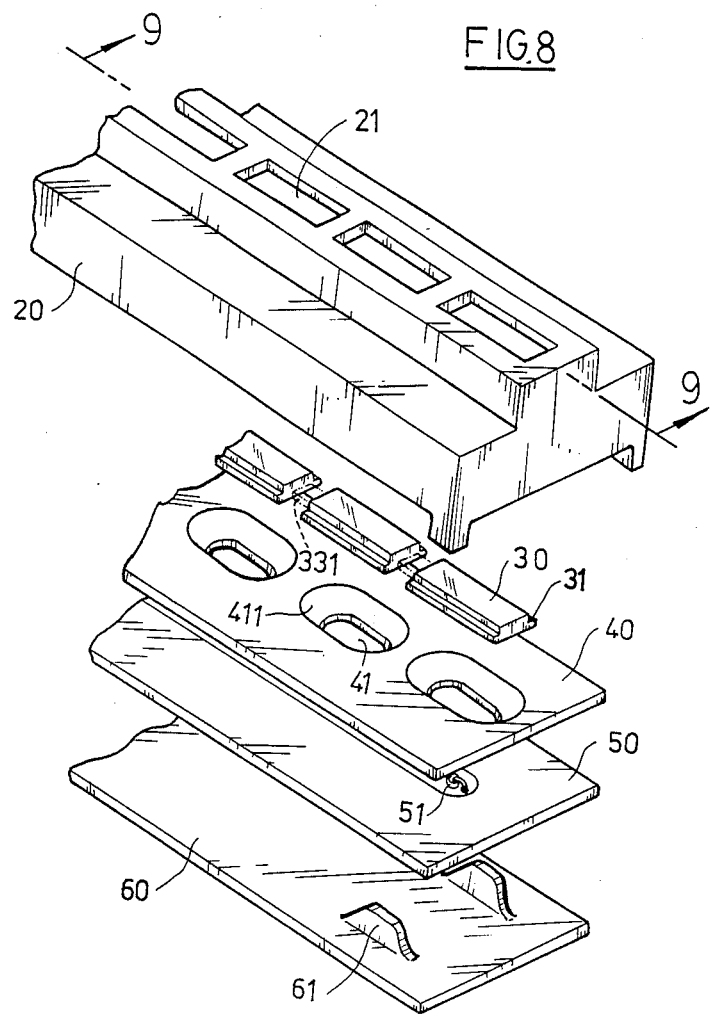
FIG. 8 is a perspective exploded view of the embodiment 3 of this invention.
Figure 9:
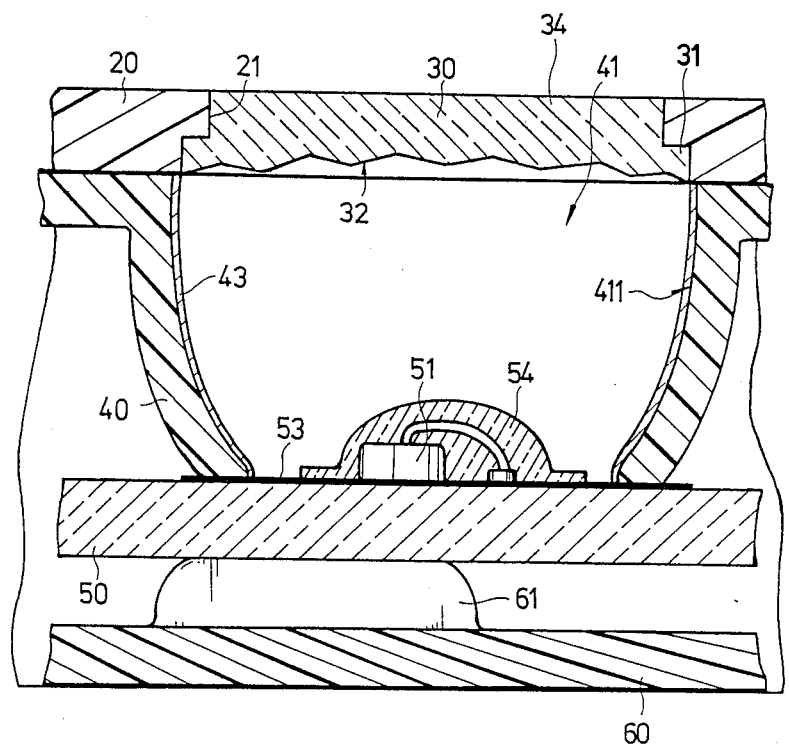
FIG. 9 is the sectional view taken along 9—9 in FIG. 8 and shows the construction of o various parts after combination.

The construction and forming art of this embodiment may be applied to array-type display in the int e same way. As shown in FIGS. 8 ad 9, the array-type case 20 has holes 21 for diaphaneity in its shallow bowl-shaped trough 24 and is formed by ejection together. After the lenses 30, kept at a definite distance by supporting ribs 331, are cut off by a punch machine, they fall into holes 21 of case 21. Then a reflector 40 and a circuit board 50 are encased in sequence. The above said construction and forming art are generally the same as that of the embodiments 1 and 2.

The duplicate figure of this embodiment shows an art in which kinds of cases 20, lenses 30, reflectors 40 and circuit boards 50 are combined into a display. In addition to encasing positioning post to positioning holes in embodiments 1 and 2, an additional cover 60, being about the same size as case 20 and having flange 61 on it, can still be added to the back of circuit board 50. And after various constructive items are encased into the shallow trough 25 of case 20, cover 60 is encased with case 20. Applying either glue or heating with high frequency wave melt cover 60 and case 20 to make the flange 61 of cover 60 the support for the back of circuit board 50. Thus, the circuit board 50, reflector 40 and various lenses are held firmly between the flange 61 and the case 20.

I claim:

1. Process of forming a light emitting display having a case facing upward, comprising the steps of:

putting a plurality of diaphaneity lenses maintained in a coplanar relationship by rib-shaped supports into the back of the case;

transporting the lenses to molding tools for punching and cutting apart the ribs between the lenses;

precisely encasing each of the diaphaneity lenses into respective pre-arranged holes on the case;

encasing a pre-formed reflector and a circuit board welded with light emitting chips in sequence onto the back of the case to effect a display.

* * * * *